(12) United States Patent
Loddenkötter

(10) Patent No.: US 6,861,741 B2
(45) Date of Patent: Mar. 1, 2005

(54) CIRCUIT CONFIGURATION

(75) Inventor: Manfred Loddenkötter, Ibbenbüren (DE)

(73) Assignee: EUPEC Europaeische Gesellschaft fuer Leistungshalbleiter mbH & Co. KG, Warstein-Belecke (DE)

( * ) Notice: Subject to any disclaimer, the term of this patent is extended or adjusted under 35 U.S.C. 154(b) by 132 days.

(21) Appl. No.: 10/277,126

(22) Filed: Oct. 21, 2002

(65) Prior Publication Data

US 2003/0102506 A1 Jun. 5, 2003

Related U.S. Application Data

(63) Continuation of application No. PCT/DE01/01504, filed on Apr. 18, 2001.

(30) Foreign Application Priority Data

Apr. 20, 2000 (DE) .......................................... 100 19 812

(51) Int. Cl.⁷ ............................................. H01L 23/48
(52) U.S. Cl. ..................................................... 257/692
(58) Field of Search ................................ 257/723, 773, 257/776, 925, 691, 692; 361/260, 264, 772, 777, 778, 784, 400–404, 409

(56) References Cited

U.S. PATENT DOCUMENTS

| 4,458,305 | A | 7/1984 | Buckle et al. |
| 4,816,984 | A | 3/1989 | Porst et al. |
| 5,325,268 | A | 6/1994 | Nachnani et al. |
| 5,488,256 | A | 1/1996 | Tsunoda |
| 5,579,217 | A | 11/1996 | Deam et al. |

FOREIGN PATENT DOCUMENTS

| DE | 195 22 173 C1 | 10/1996 |
| EP | 0 584 668 A1 | 3/1994 |
| EP | 0 871 222 A2 | 10/1998 |

*Primary Examiner*—David A. Zarneke
(74) *Attorney, Agent, or Firm*—Laurence A. Greenberg; Werner H. Stemer; Ralph E. Locher

(57) ABSTRACT

To compactly design a circuit configuration of a plurality of electronic components a power semiconductor module, in particular, an externally controllable, matrix converter has conduction devices for input, control, and output signals and/or a connecting device for the electronic components formed among one another as a bus structure on a base substrate.

18 Claims, 5 Drawing Sheets

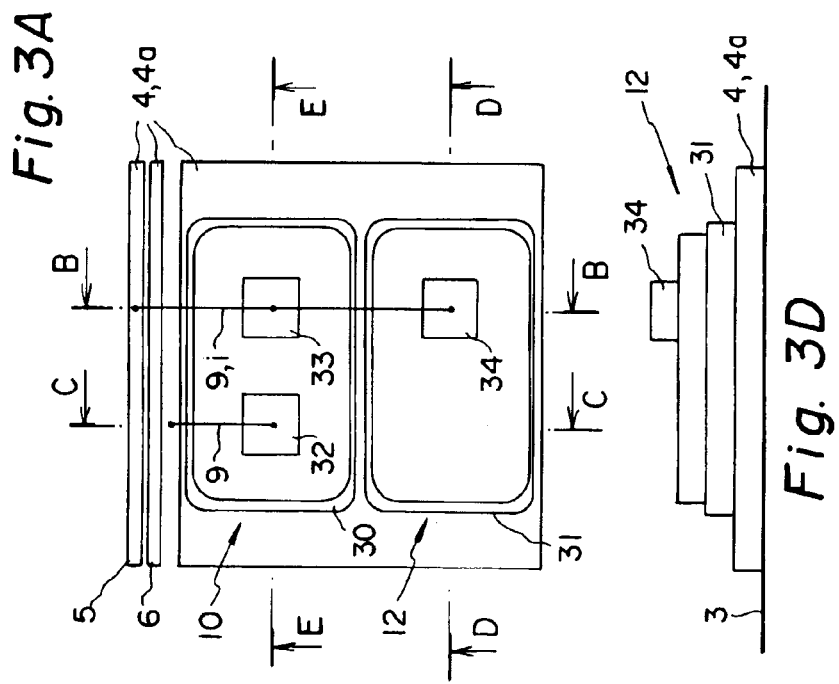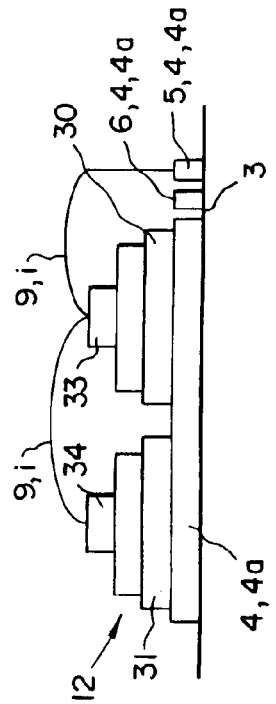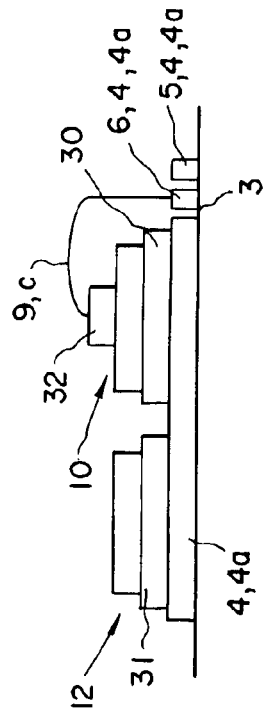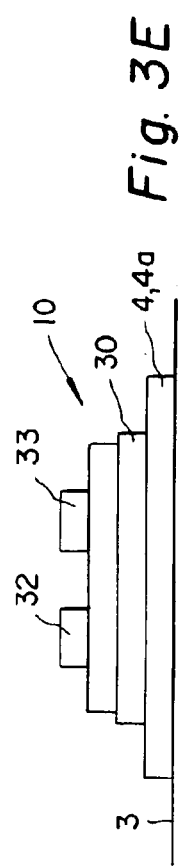

CIRCUIT CONFIGURATION

CROSS-REFERENCE TO RELATED APPLICATION

This application is a continuation of copending International Application PCT/DE01/01504, filed Apr. 18, 2001, which designated the United States and which was not published in English.

BACKGROUND OF THE INVENTION

Field of the Invention

The invention relates to a circuit configuration in the form of a power semiconductor module having a common base substrate, on which a plurality of electronic components is disposed.

In the case of circuit configurations of electronic components, in particular, in the case of semiconductor modules, power semiconductor modules, or the like, the electronic components are disposed on a common base substrate and are connected to one another at least partly, e.g., in pairs by connecting devices and, if appropriate, are furthermore supplied with or relieved of corresponding signals by corresponding further power devices that are configured for feeding in input signals and/or control signals and, respectively, for carrying away output signals.

In the case of such prior art circuit configurations, in particular, in module form, there is an increased need to configure a multiplicity of contact connections provided in the circuit configuration between the electronic components, on one hand, among one another and, on the other hand, to corresponding connecting and/or conduction devices for external contact connection in as space-saving and flexible a manner as possible and, nonetheless, reliably.

In the case of prior art interconnections of electronic components within circuit configurations, in particular, within modules and the like and, in particular, in the case of so-called matrix converters, the circuit configuration is fed an input signal that, under certain circumstances, has a plurality of components and is, then, converted, through the interconnection of the electronic components, into an output signal, if appropriate, likewise having a plurality of components, which is to be carried away through a further conduction device. In such a case, the conversion is realized and effected, on one hand, by the nature of the electronic components but, on the other hand, also precisely by the corresponding interconnection of the electronic components through the connecting device.

In the case of prior art circuit configurations, in particular, in the case of matrix converters having a module configuration or the like, the corresponding connecting device is embodied for the at least partly pairwise contact connection of the electronic components through separate conduction devices, preferably through wire bonds. This contact connection through wire bonds or explicitly provided individual connecting devices allows compact integration of the interconnection of the electronic components in the circuit configuration only to a limited extent and, furthermore, prevents a clear tapping-off of the different electrical potentials occurring within the circuit configuration for the purpose of further processing, for example, at the exterior of a corresponding module housing.

SUMMARY OF THE INVENTION

It is accordingly an object of the invention to provide a circuit configuration that overcomes the hereinafore-mentioned disadvantages of the heretofore-known devices of this general type and that provides a configuration of electronic components, in particular, a semiconductor module, a power semiconductor module, a matrix converter, or the like, in which the configuration of the circuit is realized in a particularly space-saving manner and, nonetheless, reliably and clearly.

With the foregoing and other objects in view, there is provided, in accordance with the invention, a power semiconductor module, including a common base substrate, electronic components disposed on the base substrate, a connecting device connecting the electronic components in pairs, an electrically conductive substrate in the form of surface regions disposed on the base substrate, a first conduction device feeding in an input signal, a second conduction device feeding in a control signal, a third conduction device carrying away an output signal, and the conduction devices and the connecting device being configured at least one of at least partly and jointly as a bus structure on the base substrate, the bus structure being configured at least partly as part of the surface regions.

A circuit configuration of electronic components, in particular, a semiconductor module, power semiconductor module, or the like, has a common base substrate, on which the electronic components are disposed, a first, second, and/or third conduction device, which are configured for feeding in an input signal, for feeding in a control signal and, respectively, for carrying away an output signal, and also a connecting device, by which the electronic components can be connected at least partly in pairs. The circuit configuration according to the invention is characterized in that the conduction devices and/or the connecting device are provided at least partly in each case and/or jointly as a bus structure on the base substrate. What is achieved thereby is that the conduction devices required for interconnection of the electronic components and/or the connecting device, which, if appropriate, respectively include a plurality of individual lines, are formed in the region of the base substrate, that is to say, for example, a circuit board or printed circuit board. As a result, the corresponding, for example, planar, structure of the base substrate is impressed thereon and they are, thus, adapted to the structure of the base substrate in a correspondingly compact and space-saving manner.

In such a case, the bus structure has, if appropriate, at least partly a plurality of individual conduction components. This is the form that is suitable for a plurality of electronic components for interconnection among and/or to one another and also to further conduction devices provided.

Although it is conceivable, in principle, to provide individual specific lines, in a manner adapted to the base substrate, in accordance with another feature of the invention, it is particularly advantageous if an electrically substantially conductive substrate, in particular, in the form of surface regions, is formed on the base substrate and if the bus structure is configured at least partly in each case as a conductive substrate, in particular, as surface regions.

Electrically conductive surface regions are usually provided on the base substrate to contact-connect and/or mechanically position and fix the electronic components and further electronic components on the upper surface or the lower surface of the base substrate in accordance with this exemplary embodiment. However, in accordance with a further feature of the invention, it is particularly advantageous if the bus structure is also configured in the form of conductive surface regions. As in the case of a printed circuit board, it is also the case with the circuit configuration in accordance with the exemplary embodiment just described that lines that are provided at least partly explicitly and, under certain circumstances, additionally are obviated if the bus structure is structured in the framework of the conductive surface regions on the base substrate.

In accordance with an added feature of the invention, it is preferred, moreover, that—precisely in the case of more complex interconnections of the electronic components—contact devices are provided, by which at least some of the electronic components can be contact-connected to the bus structure and/or to one another. What is achieved thereby is that individual conduction components of the bus structure can also be achieved in any desired combination of the electronic components. This is all the more important and necessary if it is considered that not all interconnection combinations enable and/or offer disentanglement of the circuit. The contact devices may in each case be embodied as an additional line, for example, bonded wires.

In accordance with an additional feature of the invention, at least some of the electronic components are configured in each case as an, in particular, externally controllable, switching device, to be precise, in particular, with an input terminal, an output terminal, and a control terminal.

In accordance with yet another feature of the invention, it is advantageous that at least some of the electronic components are configured as a parallel circuit formed by an electronic switch and a diode device. Some of the electronic switches are configured in each case as a transistor, a triac, a thyristor, preferably, as an IGBT, or the like.

In accordance with yet a further feature of the invention, advantageously, at least some of the electronic switches have a collector or drain region and an emitter or source region, the collector or drain region in each case being contact-connected to a cathode region of the diode device and the emitter or source region in each case being contact-connected to an anode region of the diode device. As such, an effective electronic switching element is produced in a particularly simple manner.

In accordance with yet an added feature of the invention, at least some of the electronic switches have a first region selected from one of a collector region and a drain region and a second region selected from one of an emitter region and a source region, the diode device has an anode region and a cathode region, the first region is respectively contact-connected to the anode region, and the second region is respectively contact-connected to the cathode region.

To control these switching elements, in accordance with yet an additional feature of the invention, at least some of the electronic switches have a base or gate region, and that the base or gate region in each case serves as a control terminal and can be connected to the second conduction device, in particular, through contact devices. Such a configuration ensures that the control signals running on the second conduction device also actually drive the electronic switch correspondingly through the gate or base region of the switch.

In accordance with again another feature of the invention, the circuit configuration is configured as an, in particular, externally controllable, matrix converter for converting a plurality of components of the input signal on the first conduction device into a plurality of components of the output signal on the third conduction device. This advantageously involves in each case three phases as are encountered, in particular, in corresponding three-phase configurations.

In accordance with again a further feature of the invention, the plurality of switching devices are assigned to one another, in particular, permanently, in a predetermined number of pairs, and that in each case the output terminal of the first component of a pair can be connected to the input terminal of the assigned second component of the pair through the contact device and/or the connecting device. Such a configuration produces a well-defined assignment of the plurality of switching devices in pairs. By way of example, in the case of the three phases of the input signal and of the output signal of a three-phase configuration, a total of 18 switching devices are provided that are disposed in nine predetermined pairs to link each of the three input phases with each of the three output phases.

In accordance with again an added feature of the invention, in each case the input terminal of the first component of a pair can be connected to the first conduction device, in particular, through contact devices, in order to receive the input signal or a part thereof, and that in each case the output terminal of the second component of a pair can be connected to the third conduction device, in particular, through contact devices, in order to output the output signal or a part thereof.

In accordance with again an additional feature of the invention, it is furthermore advantageous that in each case either the emitter or source region or the collector or drain region of the components of a pair of electronic switching devices can be connected to one another through contact devices and/or the connecting device. As a result, the individual pairs of switching devices are held at a common emitter or source potential or at a common collector or drain potential.

In accordance with still another feature of the invention, there are provided signal terminals feeding in and/or carrying away useful and/or control signals, the signal terminals are disposed in ordered potential groups; and the groups of the terminals are formed separately from one another.

In accordance with still a further feature of the invention, the groups of the terminals respectively have an approximately identical potential among one another and form potential islands isolated from one another.

In accordance with still an added feature of the invention, one of the input and output terminals and regions of the input and output terminals are constructed substantially symmetrical and/or identical.

With the objects of the invention in view, there is also provided an externally controllable, matrix converter for converting components of an input signal into components of an output signal, including a common base substrate, electronic components disposed on the base substrate, a connecting device connecting the electronic components in pairs, an electrically conductive substrate in the form of surface regions disposed on the base substrate, a first conduction device receiving the input signal, a second conduction device feeding in a control signal, a third conduction device carrying away an output signal, the conduction devices and the connecting device being configured at least one of at least partly and jointly as a bus structure on the base substrate, the bus structure being configured at least partly as part of the surface regions, and the conduction devices, the electronic components, the base substrate, the conductive substrate, and the connecting device converting the components of the input signal on the first conduction device into the components of the output signal on the third conduction device.

Other features that are considered as characteristic for the invention are set forth in the appended claims.

Although the invention is illustrated and described herein as embodied in a circuit configuration, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 3A is a sectional plan view of an electronic switching device in the matrix converter of FIG. 2;

FIG. 3B is a sectional side view of the electronic switching device of FIG. 3A along section line B—B;

FIG. 3C is a sectional side view of the electronic switching device of FIG. 3A along section line C—C;

FIG. 3D is a sectional side view of the electronic switching device of FIG. 3A along section line D—D;

FIG. 3E is a sectional side view of the electronic switching device of FIG. 3A along section line E—E;

DESCRIPTION OF THE PREFERRED EMBODIMENTS

Figure 1:
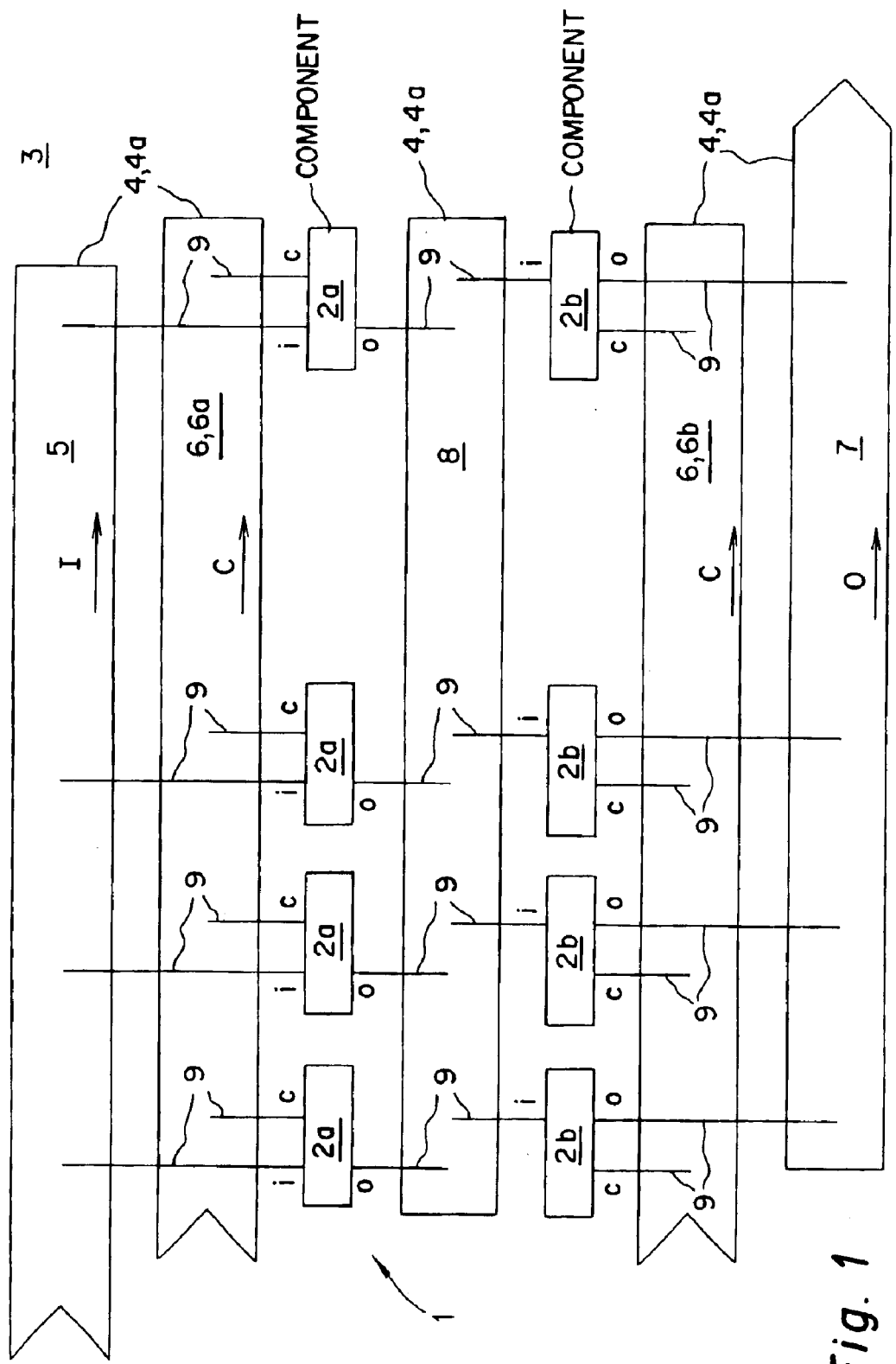
FIG. 1 is a block circuit diagram of a first embodiment of the circuit configuration according to the invention.

Referring now to the figures of the drawings in detail and first, particularly to FIG. 1 thereof, there is shown, in the form of a diagrammatic block diagram, a first exemplary embodiment of the circuit configuration 1 according to the invention, from which the basic bus structure of the configuration according to the invention emerges.

On a base substrate 3 of the circuit configuration 1, electronic components 2a and 2b are disposed and fixed on regions 4a of a conductive substrate. These electronic components 2a and 2b in each case have an input terminal i, an output terminal o, and a control terminal c.

In the exemplary embodiment of the circuit configuration according to the invention as shown in FIG. 1, the totality of the electronic components 2a and 2b is subdivided into a first subtotality of components 2a and into a second subtotality of components 2b, which can be interconnected to one another by their output terminals o and, respectively, by their input terminals i by a connecting device 8 provided on the base substrate 3, for example, in the form of a connecting bus with a plurality of individual conduction components. The electronic components 2a of the first subtotality and the electronic components 2b of the second subtotality are respectively disposed successively in a series, spatially separated by the connecting device 8, and are opposite the latter in each case in pairs; however, this is not intended to imply in such an exemplary embodiment that the mutually opposite pairs of electronic components 2a and 2b are also interconnected directly to one another through their output terminals o and input terminals i. This may be the case, but is not absolutely necessary and depends on the respective application.

Furthermore, a first conduction device 5, namely an input bus, is provided on the base substrate 3 of the circuit configuration 1 according to the invention, which input bus carries an input signal I that, if appropriate, has a plurality of components and is fed to the electronic components 2a of the first subtotality through the input terminals i through the corresponding contact or connecting devices 9, for example, in the form of bonding wires. In such a case, different electronic components 2a of the first subtotality can also be fed different signal components of the input signal I.

On the other hand, a third conduction device 7, namely the so-called output bus, is also provided on the base substrate 3, which output bus carries the output signal O that is fed from the electronic components 2b of the second subtotality and, if appropriate, has a plurality of components. This output signal O is composed of the contributions to the output signal O that are fed to the output bus 7 from the electronic components 2b of the second subtotality through the output terminals o thereof by corresponding connecting devices 9, for example, in the form of bonding wires.

Furthermore, any second conduction device 6, namely the so-called control bus, is provided for controlling the electronic components 2a and 2b, which control bus is subdivided, in the exemplary embodiment shown in FIG. 1, into a control bus 6a for the electronic components 2a of the first subtotality and, spatially separate therefrom, into a second control bus 6b for the electronic components 2b of the second subtotality. The control bus 6 or 6a, 6b carries the control signal C having, if appropriate, a plurality of components.

Thus, the bus structure provided in the case of the circuit configuration 1 according to the invention is formed in this case by the parallel individual conduction devices and connecting devices, namely, the individual bus elements 5, 6a, 6b, and 7, which are configured on the base substrate 3 of the circuit configuration according to the invention as surface regions 4a of the conductive substrate 4 disposed on the base substrate 3.

Figure 2:
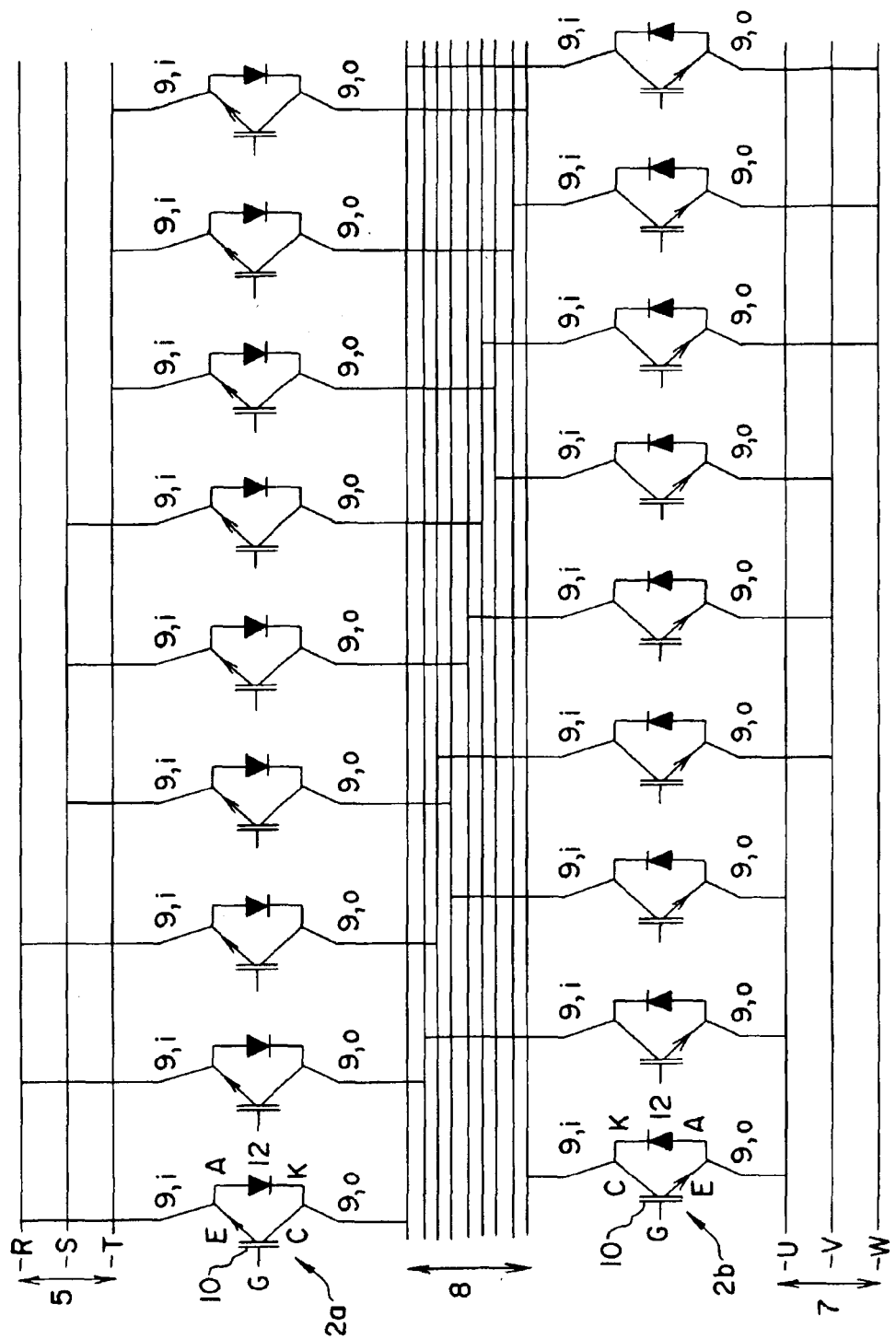
FIG. 2 is a schematic circuit diagram of a matrix converter in a second embodiment of the circuit configuration according to the invention.

FIG. 2 shows, in the form of a circuit diagram, a further exemplary embodiment of the circuit configuration 1 according to the invention, to be precise in the form of a so-called matrix converter in which the input signal I is formed by the individual phases R, S, and T, which input signal is then converted into an output signal 0 including the phases U, V, and W by the corresponding circuit configuration.

In the exemplary embodiment of FIG. 2, eighteen identical electronic components 2a and 2b are provided, which are interconnected to one another through a connecting bus 8 with nine individual components. The 2×9=18 individual electronic components 2a and 2b on the connecting bus 8 represent exactly the matrix interconnection of the three input phases R, S, and T into the three output phases U, V, and W.

As has already been mentioned above, the eighteen electronic components 2a and 2b are of substantially identical construction, each individual electronic component 2a and 2b being formed from a parallel circuit including an IGBT 10 with a corresponding diode 12. In this case, the anode A of the respective diode 12 is connected to the emitter E of the IGBT 10, whereas the cathode K of the diode 12 is connected to the collector C of the IGBT 10. Furthermore, through the connecting device 8, namely, the connecting bus, in each case an electronic component 2a of the first subtotality, namely of the upper series of components, is interconnected to a component 2b of the second subtotality, namely, the second series of components disposed underneath, such that the respective collectors C of the IGBTs 10 are in electrical contact with one another. A so-called common-collector configuration is the term used in such a case. In principle, however, a so-called common-emitter configuration is also conceivable, in which the emitters E of the interconnected electronic components 2a and 2b are in each case in contact with one another through the connecting bus 8.

The control terminals of the IGBTs 10, which control terminals are designated by G here for the sake of simplicity, are, in principle, contact-connected to a control bus that carries the corresponding control signals. This control bus is not explicitly illustrated graphically in FIG. 2.

FIGS. 3A to 3E show, in diagrammatic plan view and in partly sectional side views, an electronic component 2a or 2b that is disposed on a base substrate 3 and includes an IGBT 10 and a diode 12.

The plan view in FIG. 3A shows that the IGBT 10 and the diode 12 are applied in each case with a lower metallization layer or region 30 and 31, respectively, which are connected to a respective inner terminal of the respective component, on a common surface region 4a of the conductive substrate 4 on the base substrate 3.

In such a case, the metallization region 30 of the IGBT 10 is conductively connected either to the emitter E or to the collector C of the IGBT 10. The metallization region 31 of the diode 12 is connected either to the cathode K or the anode A of the diode 12. The metallization region 30 of the IGBT 10 and the metallization region 31 of the diode 12 are, thus, at the same electrical potential.

Furthermore, the metallization regions 33 and 34 of the IGBT 10 and of the diode 12, respectively, are also at the same potential, which is communicated through the first conduction device 5, namely the input bus, which is likewise configured as a surface region 4a of the conductive substrate 4 on the base substrate 3, to be precise through a corresponding contact device 9, for example, a bonding wire. Correspondingly, the metallization region 33 of the IGBT 10 is connected to the collector C or to the emitter E of the IGBT 10, while the metallization region 34 of the diode 12 is connected to the cathode K or anode A of the diode 12.

The IGBT 10 is controlled through the gate, which is likewise connected to a metallization region 32 and, through a corresponding contact device 9, to the control bus 6, which is likewise configured as a surface region 4a of the conductive substrate 4 on the base substrate 3.

FIGS. 3B to 3E show corresponding cross-sectional side views along the lines B—B, C—C, D—D, and E—E from FIG. 3A, in each case in the viewing direction of the arrows. Both the layered construction of the substrate with base substrate 3 and conductive substrate 4 and the layered construction of the electronic components, namely, the diode 12 and the IGBT 10, become clear from these cross-sectional views.

Figure 4:
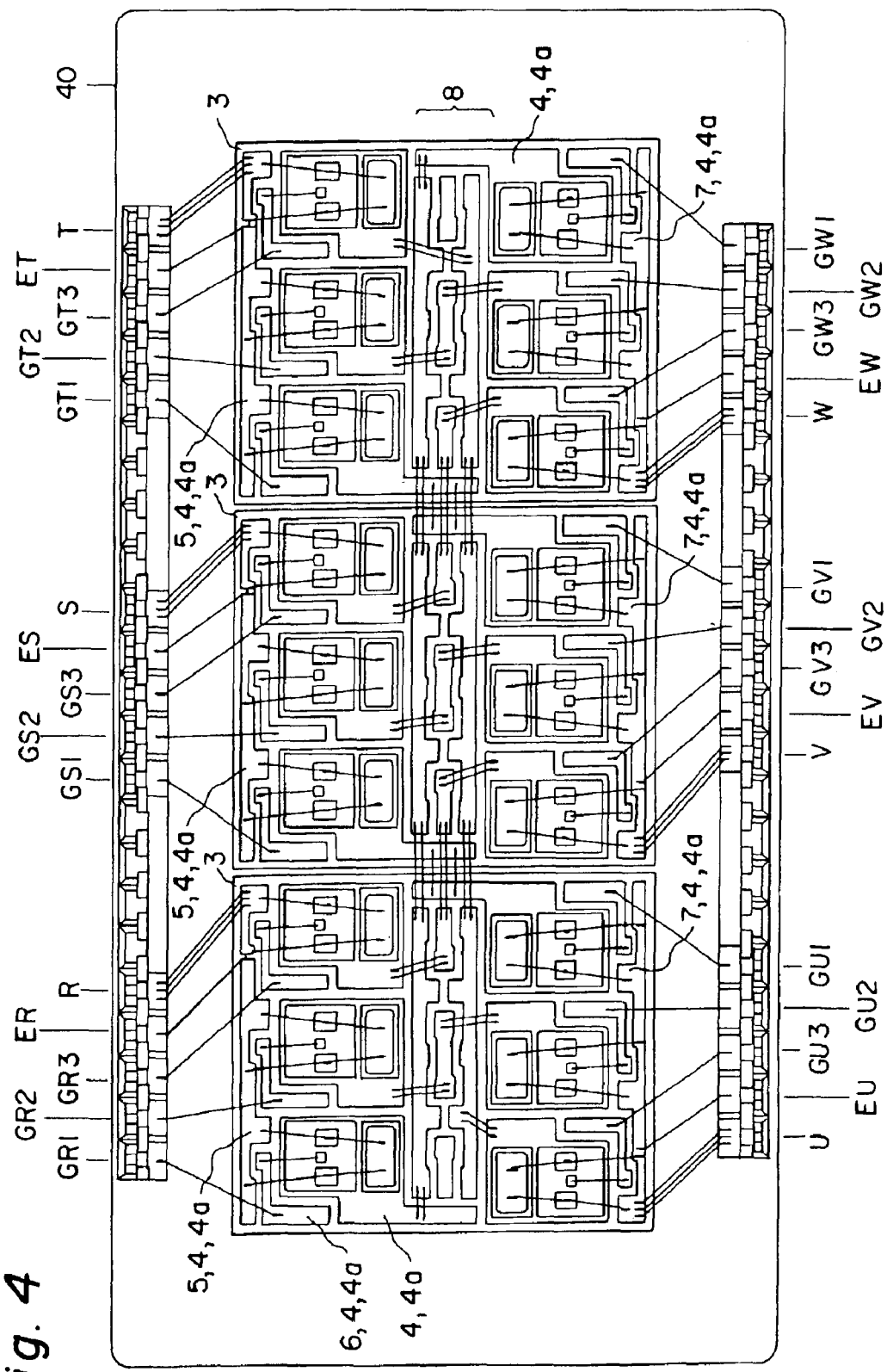
FIG. 4 is a diagrammatic plan view of a further embodiment of the circuit configuration according to the invention.
Figure 5:
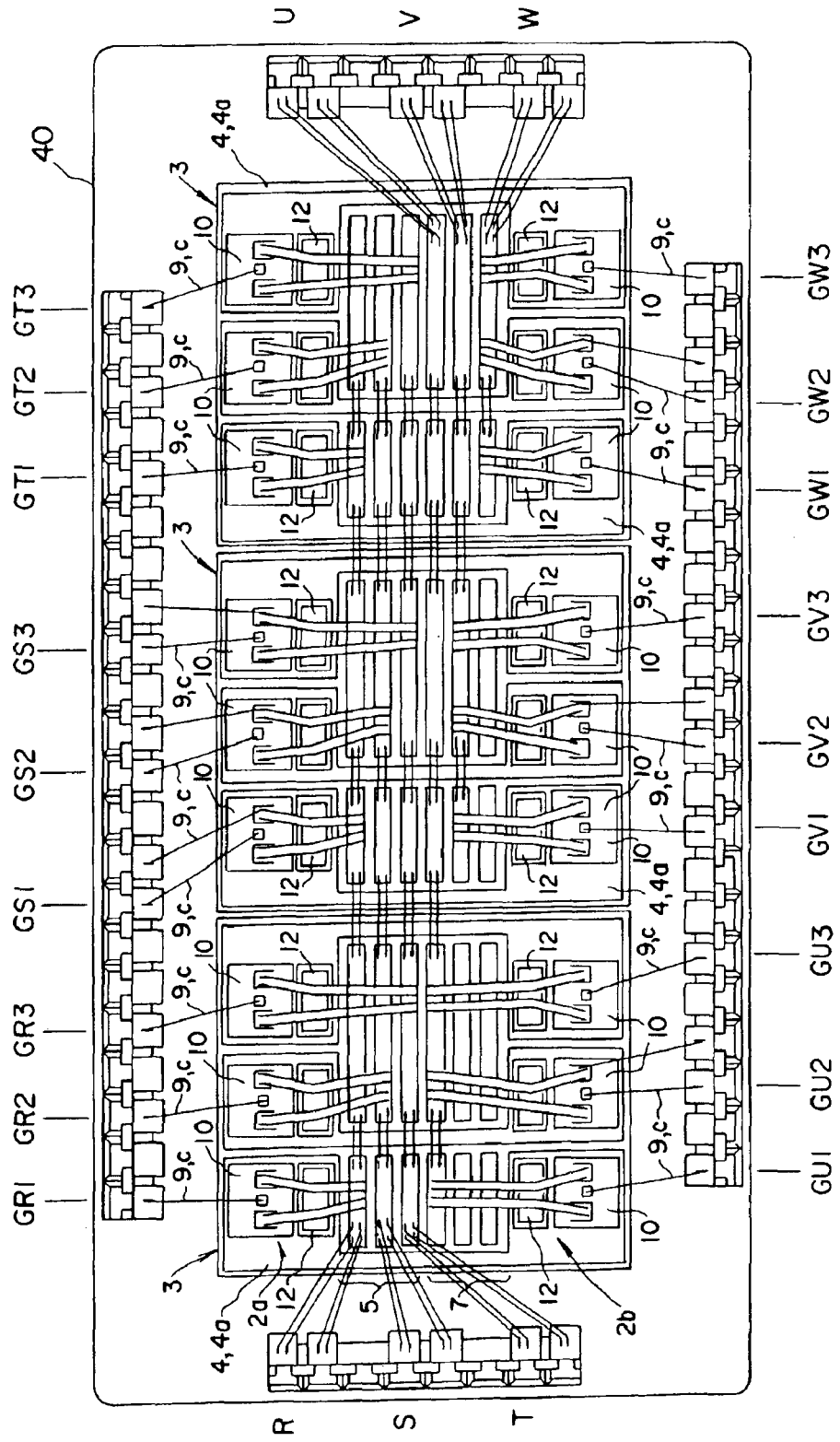
FIG. 5 is a diagrammatic plan view of another embodiment of the circuit configuration according to the invention.

FIGS. 4 and 5 show plan views of two further embodiments of the circuit configuration 1 according to the invention, to be precise with the realization of the matrix converter shown in FIG. 2. In such a case, the totality of the eighteen electronic switching devices 2a and 2b required is realized by interconnection of eighteen configurations, as is shown substantially in FIGS. 3A to 3E.

The terminals for the input phases R, S, and T are formed in the upper edge region of the housing 40, where the terminals GR1 to GT3 for the control signals are also provided.

In a manner analogous to FIG. 2, the electronic components 2a and 2b, each including an IGBT 10 and a diode 12, are also disposed in two series one above the other in the housing 40, the upper series of components 2a representing the first subtotality and the lower series of components 2b representing the second subtotality. Formed directly above the upper series of components is the input bus 5, that is to say, the first conduction device, to be precise for each of the phases R, S, and T piecewise as surface region 4a of the conductive substrate 4 on the base substrate 3. The piecewise configuration of the input bus 5 for each of the phases R, S, and T, namely, only where an interconnection and contact-connection to the electronic components 2a is actually necessary, result in a considerable space saving and compact configuration. Three electronic components 2a are always disposed in a block, so that three blocks are produced, each block being assigned to one of the input phases R, S, or T.

In each of these blocks, a triac of surface regions 4a of the control bus 6a is formed below the surface region 4a of the input bus 5. The control bus 6a is also configured as a configuration of surface regions 4a of the conductive substrate 4 on the base substrate 3, to be precise, again, in sections for each of the control signals only in the spatial region that is necessary for contact connection to the respective electronic component 2a.

Between the two series of electronic components 2a of the first subtotality and electronic components 2b of the second subtotality, it is possible to discern the configuration of the connecting bus 8 for the respective electronic components 2a and 2b. The connecting bus 8 is also configured as a configuration of surface regions 4a of the conductive substrate 4 on the base substrate 3. The bus 8 in its totality likewise again being formed only in sections, which results in a considerable space saving.

Below the series of electronic components 2b of the second subtotality, it is possible to discern the configuration of the second part of the control bus 6b, likewise in the form of surface regions 4a of the conductive substrate 4 on the base substrate 3. This is followed by the output bus 7, which is likewise configured in sections and is contact-connected to corresponding terminals for the phases U, V, and W in the housing 40.

All the individual conduction components of the bus system formed by the input bus 5, by the control bus 6a and 6b, and by the output bus 7 and also by the connecting bus 8 are configured in sections exclusively in the regions as surface regions 4a of the conductive substrate 4 on the base substrate 3 where contact connection to a corresponding terminal of an electronic component, of another bus, or of a housing terminal is necessary. As has already been described in detail above, the respective terminals are realized, if appropriate, by corresponding contact-connecting devices 9, in particular, in the form of bonding wires.

FIG. 5 likewise shows a corresponding circuitry for a matrix converter with input phases R, S, and T and output phases U, V, and W, it being possible for these phases to be fed in and tapped off at the left-hand edge and at the right-hand edge, respectively, of the housing 40 of the matrix converter. The control signals GR1 to GT3 are fed in at the upper and at the lower housing edge and the control signals GU1 to GW3 are fed in at the lower housing edge.

The bus system of the exemplary embodiment of the circuit configuration according to the invention in FIG. 5 exclusively includes the combination of input bus 5 and output bus 7. The feeding-in of the control signals GR1 to GW3 is realized by direct contact devices 9, namely, bonding wires. The connecting bus 8 is configured in pieces and connects the electronic components 2a and 2b of the first subtotality and of the second subtotality, which components are disposed one above the other, to one another in pairs through their emitters and collectors, respectively, so that the respective opposite electronic components 2a and 2b are directly electrically connected to one another.

In preferred embodiments of the circuit configuration according to the invention, terminals are provided for feeding in and/or carrying away control and/or useful signals. Preferably, these terminals form groups that are configured to be isolated from one another geometrically and in respect of potential in the circuit configuration. In the exemplary embodiment shown in FIG. 4, this preferred embodiment is realized in that the respective terminals of the input phases of the matrix converter, namely R, S, and T, and the output phases, namely U, V, and W, are disposed separately in a housing with regard to the input-output terminals and with regard to the control terminals and the corresponding circuit units that generate or feed in the potentials are also formed on potential islands that are isolated from one another on the circuit board, namely, the carrier 3. Thus, e.g., for the first input phase R, the input phase terminal R and also the gate control terminals GR1, GR2, and GR3 and also the emitter control terminal $E_R$ form a terminal group that is isolated from the remaining groups and can be tapped off externally on the housing 40. The situation is similar with the terminal group GS1, GS2, GS3, $E_S$, and S of the second input phase S. The same also applies correspondingly to the last input phase T and also to the output phases U, V, and W of the matrix converter according to the invention.

With regard to the input phases R, S, and T, that is to say, in particular, with regard to the corresponding input phase terminals R, S, and T, and with regard to the output phases U, V, and W, that is to say, in particular, with regard to the corresponding output phase terminals U, V, and W, the circuit configuration of the exemplary embodiment of FIG. 4 is constructed substantially symmetrically or identically.

I claim:

1. A power semiconductor module, comprising:
    a common base substrate;
    electronic components disposed on said base substrate;
    a connecting device connecting said electronic components in pairs;
    an electrically conductive substrate in the form of surface regions disposed on said base substrate;
    a first conduction device feeding in an input signal;
    a second conduction device feeding in a control signal;
    a third conduction device carrying away an output signal;
    said conduction devices and said connecting device being configured at least one of at least partly and jointly as a bus structure on said base substrate, said bus structure being configured at least partly as part of said surface regions,
    at least some of said electronic components being configured as a parallel circuit formed by an electronic switch and a diode device, said electronic switch of some of said electronic components being one of the group consisting of a transistor, a triac, a thyristor, and an IGBT, at least some of said electronic switches having:
        a first region selected from one of a collector region and a drain region; and
        a second region selected from one of an emitter region and a source region;
    said diode device having an anode region and a cathode region;
    said first region being respectively contact-connected to said cathode region;
    said second region being respectively contact-connected to said anode region;
    the power semiconductor module being an externally controllable, matrix converter for converting a plurality of components of the input signal on said first conduction device into a plurality of components of the output signal on said third conduction device.

2. The power semiconductor module according to claim 1, wherein said bus structure has in each case at least partly a plurality of individual conduction components.

3. The power semiconductor module according to claim 1, including contact devices contact-connecting at least one of:
    some of said electronic components to said bus structure; and
    some of said electronic components to one another.

4. The power semiconductor module according to claim 1, wherein at least some of said electronic components have an externally controllable switching device.

5. The power semiconductor module according to claim 4, wherein said externally controllable switching device has an input terminal, an output terminal, and a control terminal.

6. The power semiconductor module according to claim 1, wherein:
    at least some of said electronic switches have a third region selected from one of a base region and a gate region;
    said third region is a control terminal; and
    contact devices connect said control terminal said second conduction device.

7. The power semiconductor module according to claim 1, wherein:
    at least some of said electronic switches have one of a base region and a gate region;
    said one of said base region and said gate region is a control terminal; and
    contact devices connect said control terminal said second conduction device.

8. The power semiconductor module according to claim 1, including:
    contact devices contact-connecting at least one of:
        some of said electronic components to said bus structure; and
        some of said electronic components to one another;
    some of said electronic components having externally controllable switching devices each having an input terminal, an output terminal, and a control terminal;
    said switching devices being assigned to one another in a predetermined number of pairs; and
    said output terminal of a first component of one of said pairs being connected to said input terminal of an assigned second component of said one of said pairs through at least one of said contact devices and said connecting device.

9. The power semiconductor module according to claim 8, wherein said switching devices are permanently assigned to one another in said predetermined number of pairs.

10. The power semiconductor module according to claim 9, wherein:
    a respective input terminal of said first component of said one of said pairs is connected to said first conduction device to receive one of the input signal and a part of the input signal; and a respective output terminal of said second component of said one of said pairs is connected to said third conduction device to output one of the output signal and a part of the output signal.

11. The power semiconductor module according to claim 9, wherein:

a respective input terminal of said first component of said one of said pairs is connected to said first conduction device through said contact devices to receive one of the input signal and a part of the input signal; and a respective output terminal of said second component of said one of said pairs is connected to said third conduction device through said contact devices to output one of the output signal and a part of the output signal.

12. The power semiconductor module according to claim 8, wherein either one of said first region and said second region of said first and second components of said one of said pairs is connected to one another through at least one of said contact devices and said connecting device.

13. The power semiconductor module according to claim 8, including signal terminals at least one of feeding in and carrying away at least one of useful signals and control signals, said signal terminals are disposed in ordered potential groups; and said groups of said terminals are formed separately from one another.

14. The power semiconductor module according to claim 13, wherein said groups of said terminals:

respectively have an approximately identical potential among one another; and form potential islands isolated from one another.

15. The power semiconductor module according to claim 8, wherein one of said input and output terminals and regions of said input and output terminals are constructed substantially symmetrical.

16. The power semiconductor module according to claim 8, wherein one of said input and output terminals and regions of said input and output terminals are constructed substantially identical.

17. A power semiconductor module, comprising:

a common base substrate;

electronic components disposed on said base substrate;

a connecting device connecting said electronic components in pairs;

an electrically conductive substrate in the form of surface regions disposed on said base substrate;

a first conduction device feeding in an input signal;

a second conduction device feeding in a control signal;

a third conduction device carrying away an output signal;

said conduction devices and said connecting device being configured at least one of at least partly and jointly as a bus structure on said base substrate, said bus structure being configured at least partly as part of said surface regions, at least some of said electronic components being configured as a parallel circuit formed by an electronic switch and a diode device, said electronic switch of some of said electronic components being one of the group consisting of a transistor, a triac, a thyristor, and an IGBT, at least some of said electronic switches having:

a first region selected from one of a collector region and a drain region; and a second region selected from one of an emitter region and a source region;

said diode device having an anode region and a cathode region;

said first region being respectively contact-connected to said anode region;

said second region being respectively contact-connected to said cathode region; and the power semiconductor module being an externally controllable, matrix converter for converting a plurality of components of the input signal on said first conduction device into a plurality of components of the output signal on said third conduction device.

18. An externally controllable, matrix converter for converting components of an input signal into components of an output signal, comprising:

a common base substrate;

electronic components disposed on said base substrate;

a connecting device connecting said electronic components in pairs;

an electrically conductive substrate in the form of surface regions disposed on said base substrate;

a first conduction device receiving the input signal;

a second conduction device feeding in a control signal;

a third conduction device carrying away an output signal;

said conduction devices and said connecting device being configured at least one of at least partly and jointly as a bus structure on said base substrate, said bus structure being configured at least partly as part of said surface regions; and said conduction devices, said electronic components, said base substrate, said conductive substrate, and said connecting device converting the components of the input signal on said first conduction device into the components of the output signal on said third conduction device.

* * * * *